(12) United States Patent
O'Meara et al.

(10) Patent No.: US 6,974,779 B2
(45) Date of Patent: Dec. 13, 2005

(54) INTERFACIAL OXIDATION PROCESS FOR HIGH-K GATE DIELECTRIC PROCESS INTEGRATION

(75) Inventors: David L O'Meara, Poughkeepsie, NY (US); Cory Wajda, Mesa, AZ (US); Tsuyoshi Takahashi, Nirasaki (JP); Alessandro Callegari, Yorktown Heights, NY (US); Kristen Scheer, Milton, NY (US); Sufi Zafar, Briarcliff Manor, NY (US); Paul Jamison, Hopewell Junction, NY (US)

(73) Assignees: Tokyo Electron Limited, Tokyo (JP); International Business Machines Corporation, Armonk, NY (US)

( * ) Notice: Subject to any disclaimer, the term of this patent is extended or adjusted under 35 U.S.C. 154(b) by 97 days.

(21) Appl. No.: 10/662,875

(22) Filed: Sep. 16, 2003

(65) Prior Publication Data

US 2005/0059259 A1    Mar. 17, 2005

(51) Int. Cl.⁷ .......................... H01L 21/469
(52) U.S. Cl. .................... 438/769; 438/770
(58) Field of Search ............. 438/3, 240, 785, 438/786, 775, 769, 770

(56) References Cited

U.S. PATENT DOCUMENTS

| | | | | |
|---|---|---|---|---|
| 6,020,024 A | * | 2/2000 | Maiti et al. | 438/287 |
| 6,228,779 B1 | | 5/2001 | Bloom et al. | |
| 6,444,592 B1 | * | 9/2002 | Ballantine et al. | 438/770 |
| 6,716,695 B1 | * | 4/2004 | Hattangady et al. | 438/240 |
| 6,784,100 B2 | * | 8/2004 | Oh et al. | 438/660 |
| 6,797,525 B2 | * | 9/2004 | Green et al. | 438/3 |
| 2001/0055824 A1 | * | 12/2001 | Gartner et al. | 438/14 |
| 2003/0057432 A1 | | 3/2003 | Gardner et al. | |
| 2004/0023462 A1 | * | 2/2004 | Rotondaro et al. | 438/287 |
| 2005/0026459 A1 | * | 2/2005 | O'Meara et al. | 438/786 |

FOREIGN PATENT DOCUMENTS

| | | |
|---|---|---|
| EP | 1 326 271 A1 | 7/2003 |
| EP | 1 469 509 A1 | 10/2004 |
| WO | WO 03/063220 A1 | 7/2003 |

OTHER PUBLICATIONS

Noriyuki Miyata et al., "Thermal Stability of a Thin HfO2/Ultrathin SiO2/Si Structure: Interfacial Si Oxidation and Silicidation," Japanese Journal of Applied Physics, vol. 42 (No. 2B, Part 2), pp. L138-L140, (Feb. 15, 2003).

M.A. Gribel Yuk et al., "Interface reactions in ZrO2 based gate dielectric stacks," Journal of Applied Physics, vol. 92 (No. 3), pp. 1232-1237, (Aug. 1, 2002).

\* cited by examiner

Primary Examiner—Tuan H. Nguyen
(74) Attorney, Agent, or Firm—Pillsbury Winthrop Shaw Pittman LLP (57) ABSTRACT

A method is provided for forming a microstructure with an interfacial oxide layer by using a diffusion filter layer to control the oxidation properties of a substrate associated with formation of a high-k layer into the microstructure. The diffusion filter layer controls the oxidation of the surface. The interfacial oxide layer can be formed during an oxidation process that is carried out following deposition of a high-k layer onto the diffusion filter layer, or during deposition of a high-k layer onto the diffusion filter layer.

33 Claims, 10 Drawing Sheets

FIG. 8

INTERFACIAL OXIDATION PROCESS FOR HIGH-K GATE DIELECTRIC PROCESS INTEGRATION

FIELD OF THE INVENTION

The present invention relates to semiconductor processing, and more particularly, to a method of utilizing a diffusion filter layer to control substrate oxidation for integrating high-k dielectric layers into semiconductor manufacturing.

BACKGROUND OF THE INVENTION

In the semiconductor industry, the minimum feature sizes of microelectronic devices are approaching the deep submicron regime to meet the demand for faster, lower power microprocessors and digital circuits. The downscaling of CMOS devices imposes scaling constraints on the gate dielectric material. The thickness of the standard $SiO_2$ gate dielectric oxide is approaching a level (~10 angstrom (A)) at which tunneling currents may significantly impact transistor performance. To increase device reliability and reduce electron leakage from the gate electrode to the transistor channel, semiconductor transistor technology is using high-k gate dielectric materials that allow increased physical thickness of the gate dielectric layer while maintaining an equivalent gate oxide thickness (EOT) of less than about 10 A.

Dielectric materials featuring a dielectric constant greater than that of $SiO_2$ (k~3.9) are commonly referred to as high-k materials. In addition, high-k materials may refer to dielectric materials that are deposited onto substrates (e.g., $HfO_2$, $ZrO_2$) rather than grown on the surface of the substrate (e.g., $SiO_2$, $SiO_xN_y$). High-k materials may incorporate metallic silicates or oxides (e.g., $Ta_2O_5$ (k~26), $TiO_2$ (k~80), $ZrO_2$ (k~25), $Al_2O_3$ (k~9), HfSiO, $HfO_2$ (k~25)).

Integration of high-k materials into gate electrode applications can require a dielectric interfacial layer at the surface of the Si substrate to preserve interface state characteristics and form an interface with good electrical properties. However, the presence of an oxide interfacial layer lowers the overall dielectric constant of the microstructure and, therefore, the oxide interfacial layer may need to be thin. The quality of the interfacial oxide dielectric layer can affect device performance, as the oxide layer is intimately connected to the channel of the transistor.

SUMMARY OF THE INVENTION

A method is provided for forming a microstructure with an interfacial oxide layer by using a diffusion filter layer to control the oxidation properties of a substrate associated with formation of a high-k layer into the microstructure. The diffusion filter layer controls the oxidation of the substrate.

In an embodiment of the invention, a method is provided for forming a microstructure, the method comprising providing a substrate, forming a diffusion filter layer on the substrate, depositing a high-k layer on the diffusion filter layer, and performing an oxidation process to grow an interfacial oxide layer, where the interfacial oxide layer growth is controlled by the diffusion constant of the diffusion filter layer.

DETAILED DESCRIPTION OF EMBODIMENTS OF THE INVENTION

Figure 1:
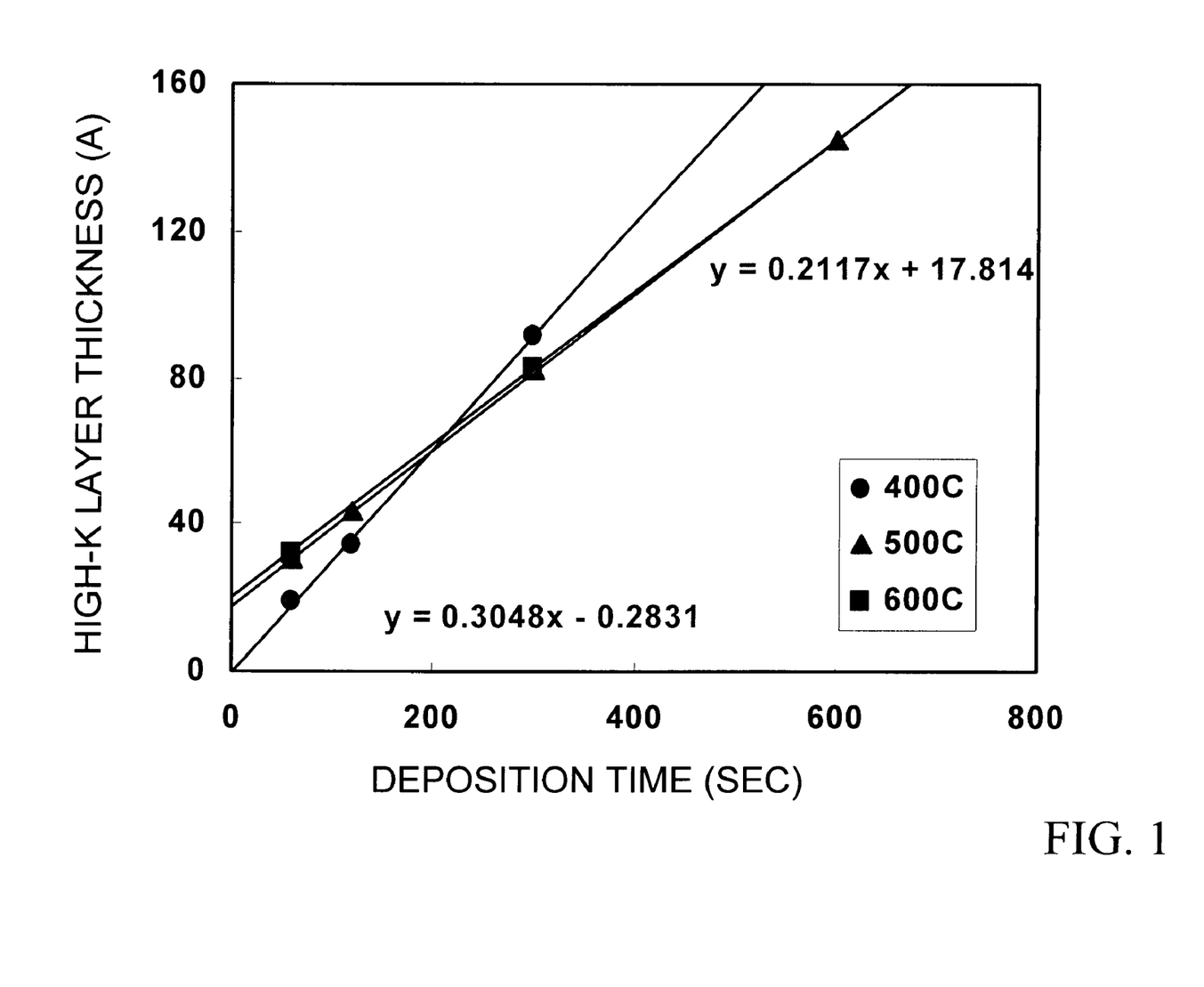
FIG. 1 shows the thickness of a high-k layer deposited by a thermal chemical vapor deposition (TCVD) process on a Si substrate as a function of deposition time.

FIG. 1 shows the thickness of a high-k layer deposited by a TCVD process on a Si substrate as a function of deposition time. A thin native oxide layer was removed from the Si substrate by a wet cleaning process using HF, prior to depositing a high-k layer on the Si substrate. A $HfO_2$ high-k layer was deposited on the clean Si substrate at substrate temperatures of 400° C., 500° C., and 600° C. The $HfO_2$ layer was deposited by a TCVD process utilizing a process gas comprising a Hf(OBu$^t$)$_4$ precursor.

In FIG. 1, the thickness of the $HfO_2$ high-k layers as a function of deposition time was fitted using linear fits of the data points. The linear relationship between the high-k layer thickness and the deposition time for the 400° C. deposition curve, along with an intercept that goes through the origin, indicates minimal growth of an interfacial oxide layer between the high-k layer and the Si substrate. However, the intercepts for the 500° C. and 600° C. deposition curves indicate the growth of an interfacial oxide layer that is about 18 A thick.

The data in FIG. 1 shows that a relatively thick interfacial oxide layer is formed during deposition of a high-k layer on a Si substrate when the deposition temperature is greater than 400° C.

In one embodiment of the invention, a diffusion filter layer is formed on a substrate to control the oxidation properties of the substrate during integration of a high-k material to form a transistor gate structure. The diffusion filter layer limits the amount of oxidizing species that reach the substrate during subsequent processing steps in the fabrication of a gate structure, thereby controlling the oxidation of the substrate and suppressing the substrate oxidation until elevated substrate temperatures are reached. In an embodiment of the invention, the diffusion filter layer can comprise at least one of a nitride layer, an oxynitride layer, or combinations or mixtures thereof. The nitrogen content of a diffusion filter layer can affect the diffusion of oxygen through the diffusion filter layer. For example, a nitride layer (e.g., SiN) generally offers greater resistance to oxygen diffusion than an oxynitride layer (e.g., $SiO_xN_y$). This allows for tailoring of the diffusion properties of the diffusion filter layer by varying the nitrogen content of the diffusion filter layer.

In mathematical terms, Fick's Law ($J=-D \times dC/dx$) describes the dependence of mass flux (J) through a layer (e.g., a diffusion filter layer), as the ratio of change in concentration (dC) to the change in layer thickness (dx), for a layer with a diffusion constant D. The partial pressure of the oxidizing ambient may be used to control the concentration gradient component, which in turn can determine the final thickness of the interfacial oxide layer given a fixed mass flux, which is at the limit of the oxidation potential (self-limited oxidation). During the oxidation process, the formation of an interfacial oxide layer, and potential oxidation of the diffusion filter layer, can affect the diffusion constant and therefore the final thickness of the interfacial oxide layer.

Figure 2:
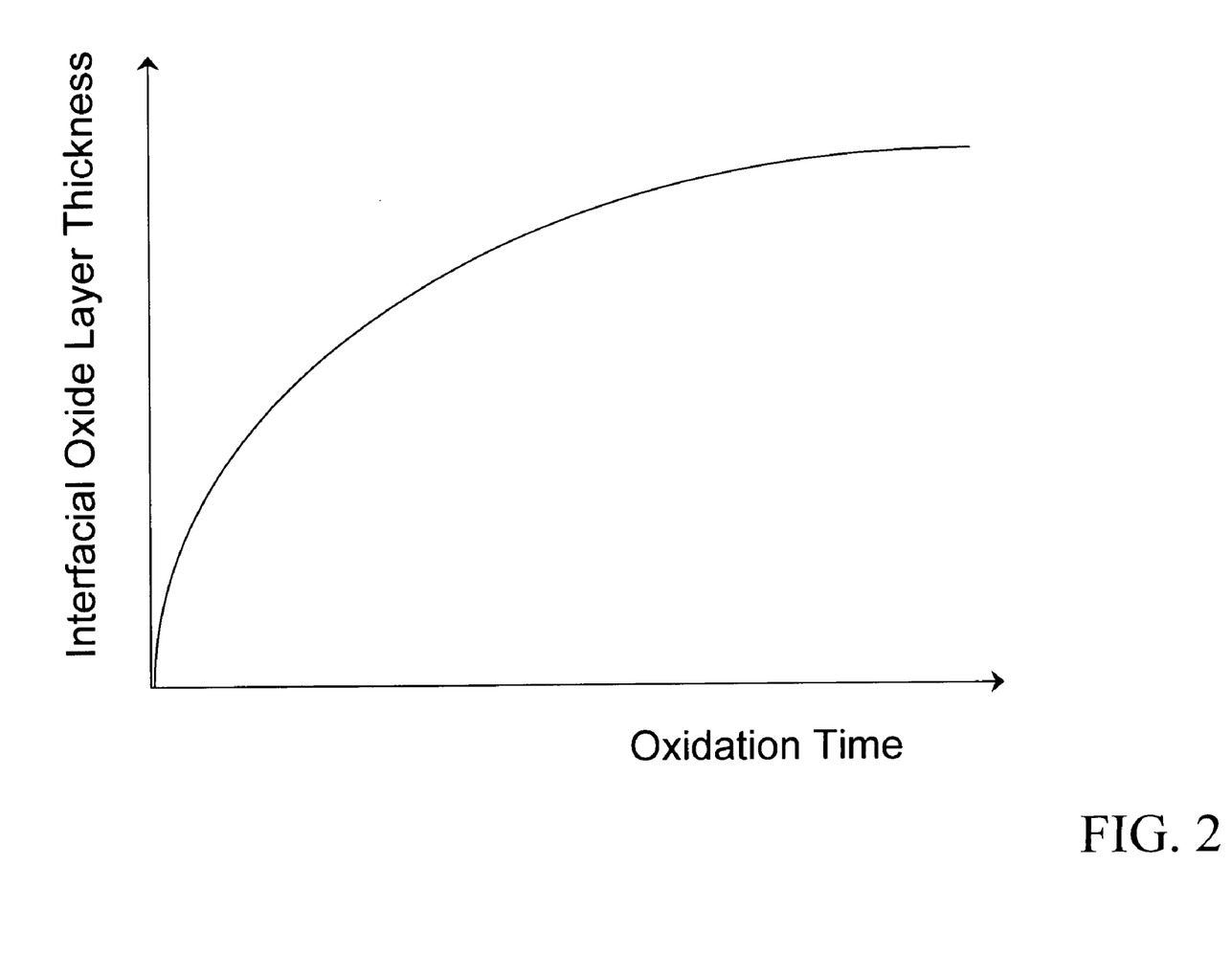
FIG. 2 schematically shows the thickness of an oxide layer, grown by a self-limiting oxidation process as a function of oxidation time.

FIG. 2 schematically shows the thickness of an oxide layer, grown by a self-limiting process, as a function of oxidation time. In a self-limiting oxidation process, the rate of oxidation decreases as the thickness of the layer increases, resulting in saturation of the oxide growth for a particular oxidation process recipe.

In addition to controlling the oxidation of the substrate in an oxidation process, the diffusion filter layer can act as a diffusion barrier to control interlayer diffusion between the substrate and other layers (e.g., a high-k layer and an electrode layer), or as a diffusion barrier between the substrate and dopants (such as boron in poly-Si or SiGe) in the gate electrode structure. During the formation of an interfacial oxide layer, the diffusion filter layer may be oxidized. Since the interfacial oxide layer and the diffusion filter layer can be only a few angstroms (A) thick, a clear boundary between the two layers may not be present. A resulting dielectric layer comprises the interfacial oxide layer and the diffusion filter layer.

Figure 3A:
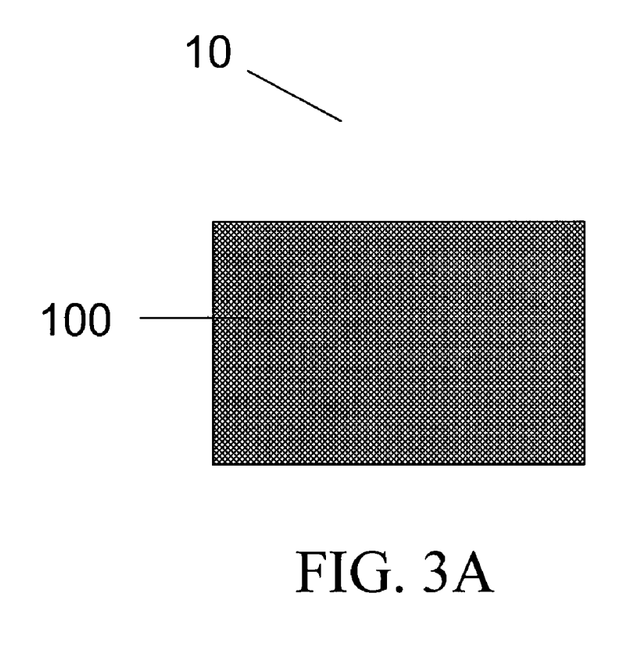
FIG. 3A schematically shows a cross-sectional view of a substrate.

FIG. 3A schematically shows a cross-sectional view of a substrate according to an embodiment of the invention. The substrate 100 can, for example, be a semiconductor substrate, such as a Si or a poly-Si substrate, or a compound semiconductor, and can include numerous active devices and/or isolation regions (not shown). The substrate 100 can be of n- or p-type, depending on the type of device being formed. A substrate can, for example, be cleaned of an oxide layer (e.g., a native oxide layer) by placing it in a liquid bath containing dilute hydrofluoric acid (HF) or, alternatively, exposing it to HF gas phase etching. The dilute HF liquid solution can be a $H_2O$:HF (e.g., 50:1) mixture. Following the HF cleaning process, the substrate can be rinsed in de-ionized (D.I.) water. Alternatively, the substrate 100 can comprise at least one of a LCD substrate and a glass substrate.

Figure 3B:
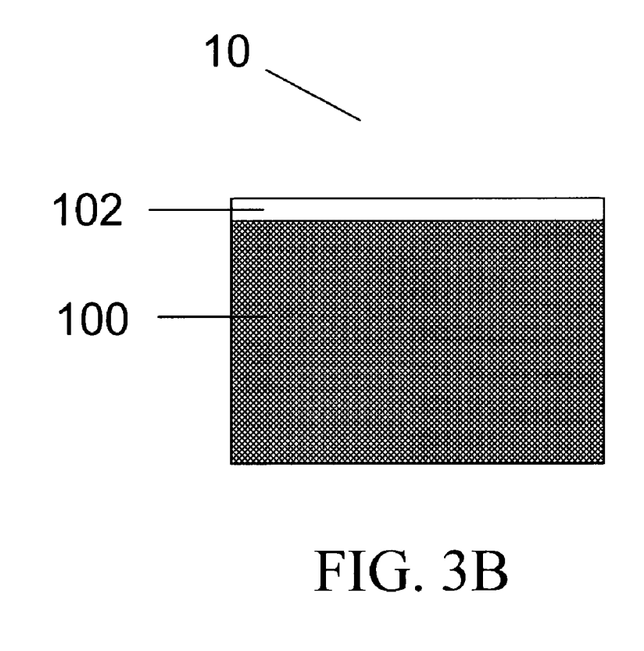
FIG. 3B schematically shows a cross-sectional view of a diffusion filter layer overlying a substrate according to an embodiment of the invention.

FIG. 3B schematically shows a cross-sectional view of a diffusion filter layer 102 overlying a substrate according to an embodiment of the invention. The diffusion filter layer 102 can be a few angstroms thick, for example, less than about 10 A, and can, for example, be formed in a self-limiting process that provides control over layer thickness and thickness uniformity. The diffusion filter layer 102 can, for example, comprise a nitride layer (e.g., $SiN_x$), an oxynitride layer (e.g., $SiO_xN_y$), or combinations or mixtures thereof, which is effective in controlling the oxidation of the substrate.

In an embodiment of the invention, a nitride layer or an oxynitride layer can, for example, be formed by a nitridation process that includes thermal nitridation, direct plasma nitridation, remote plasma nitridation, plasma-enhanced nitridation, UV-nitridation, and radical flow nitridation. In one embodiment of the invention, a nitridation process is carried out on a $SiO_2$ layer. The nitridation process can be carried out in a nitrogen-containing environment comprising at least one of NO, $N_2O$, $NO_2$, $N_2$, and $NH_3$. Furthermore, the nitrogen-containing environment can contain an inert gas, including, for example, at least one of Ar, He, and Xe. The nitridation process can be carried out at a substrate temperature below about 1000° C. Alternatively, a nitride layer or an oxynitride layer can be deposited onto a substrate utilizing known deposition methods such as thermal chemical vapor deposition (TCVD), that is carried out in the absence of a plasma, plasma-enhanced chemical vapor deposition (PECVD), or atomic layer deposition (ALD).

In one embodiment of the invention, a preclean process can be performed on the substrate. The preclean process can, for example, include removing an oxide layer and/or organic contaminants from the substrate surface, thereby preparing the substrate for deposition of a diffusion filter layer. A preclean process can improve the uniformity of a diffusion filter layer that can, for example, be deposited on the substrate by an ALD process.

Figure 3C:
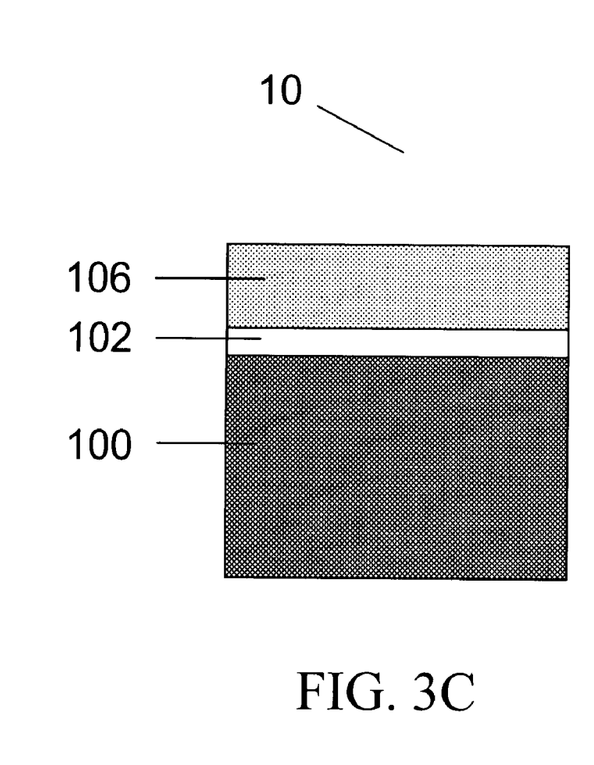
FIG. 3C schematically shows a cross-sectional view a high-k layer deposited onto a diffusion filter layer according to an embodiment of the invention.

FIG. 3C schematically shows a cross-sectional view of a high-k layer deposited onto a diffusion filter layer according to an embodiment of the invention. The high-k layer 106 can, for example, be deposited onto the diffusion filter layer 102 using various well-known deposition processes, including, but not limited to, TCVD, PECVD, ALD, and physical vapor deposition (PVD). The high-k layer 106 can, for example, be a metal oxide layer that is less than 30 A thick and comprises at least one of $Ta_2O_5$, $TiO_2$, $ZrO_2$, $Al_2O_3$, $Y_2O_3$, $HfSiO_x$, $HfO_2$, $ZrSiO_x$, $TaSiO_x$, $SrSiO_x$, and $LaO_x$.

When depositing a metal oxide high-k dielectric layer using CVD, a process gas comprising a metal-containing precursor can be introduced into a processing chamber containing a heated substrate to be processed. The substrate is exposed to the process gas for a time period that results in the desired deposition of the metal oxide dielectric layer.

The process gas can further comprise a carrier gas (e.g., an inert gas) and an oxidizing gas. The inert gas can include at least one of Ar, He, Ne, Kr, Xe, and $N_2$. The addition of inert gas can, for example, dilute the process gas or adjust the process gas partial pressure(s). The oxidizing gas can, for example, contain an oxygen-containing gas comprising at least one of $O_2$, $O_3$, $H_2O$, $H_2O_2$, NO, $NO_2$, and $N_2O$. The role of the oxygen-containing gas in the deposition process can be to fill any oxygen vacancies in the metal oxide high-k layer, or to chemically modify the metal oxide precursor. The modification can involve interaction of the oxygen-containing gas with the metal oxide precursor in the gas phase or on the deposition surface.

The presence of a diffusion filter layer on a substrate may improve the continuity of a high-k layer that is deposited onto the diffusion filter layer. Improved layer continuity can allow for the use of thinner dielectric layers in gate structures. Furthermore, a diffusion filter layer may prevent reactions between the high-k dielectric layer and the substrate (e.g., a Si substrate), thereby preventing formation of detrimental interfacial compounds, such as silicates. In another embodiment of the invention, a surface preparation process can be performed on the deposited diffusion filter layer to improve nucleation characteristics of the subsequent high-k deposition process.

Figure 3D:
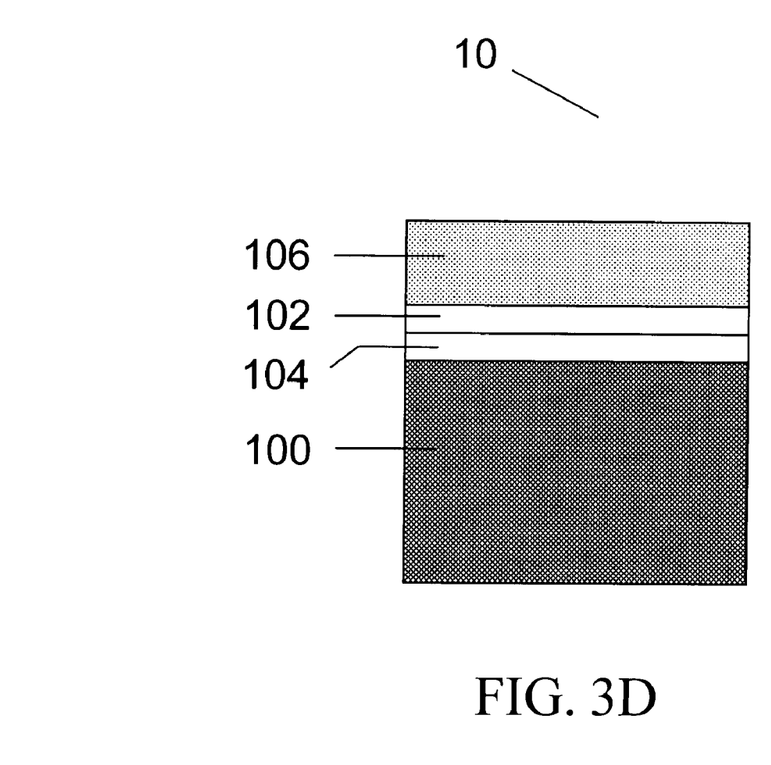
FIG. 3D schematically shows a cross-sectional view of an interfacial oxide layer formed in an oxidation process according to an embodiment of the invention.

FIG. 3D schematically shows a cross-sectional view of an interfacial oxide layer grown in an oxidation process according to an embodiment of the invention. The oxidation process can, for example, comprise thermal annealing of the structure 10 shown in FIG. 3C at a substrate temperature between 300° C. and 1000° C. A substrate temperature that is greater than about 650° C. may be employed, for example, for forming an oxide layer. During the oxidation process, oxygen from the high-k layer and/or from an oxygen-containing gas in the oxidation process environment, can diffuse through the diffusion filter layer 102 and form the interfacial oxide layer 104. The combined thickness of the diffusion filter layer 102 and the interfacial oxide layer 104 can, for example, be less than about 20 A. The oxidation process can utilize an oxygen-containing gas comprising at least one of $O_2$, $O_3$, $H_2O$, $H_2O_2$, NO, $NO_2$, and $N_2O$, and optionally an inert gas, or alternatively, the oxidation process can be carried out in the absence of an oxygen-containing gas. The oxidation process can be carried out at a substrate temperature between about 300° C. and about 1000° C.

Diffusion filter layer 102 controls the thickness and oxide quality of interfacial layer 104. For example, diffusion filter layer 102 can control the extent of or even prevent the formation of the interfacial oxide during high-k layer deposition. Diffusion filter layer 102 can permit controlled interfacial oxide growth at a temperature selected to form a dielectric oxide of desired quality while controlling the thickness of the interfacial oxide.

Figure 3E:
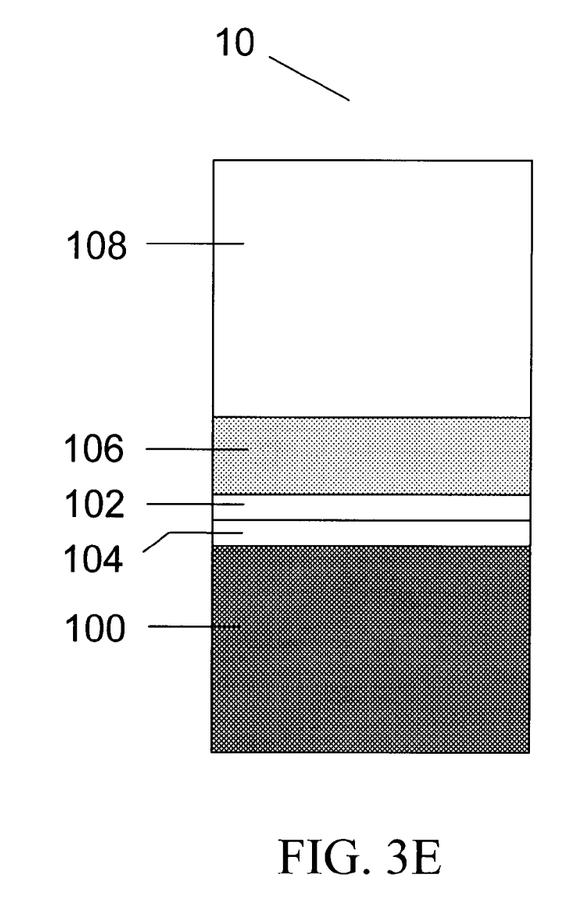
FIG. 3E schematically shows an electrode layer formed on the structure in FIG. 3D according to an embodiment of the invention.

FIG. 3E schematically shows an electrode layer formed on the structure in FIG. 3D according to another embodiment of the invention. In addition to the traditional doped poly-Si, the electrode layer 108 can, for example, comprise at least one of W, Al, TaN, TaSiN, HfN, HfSiN, TiN, TiSiN, Re, Ru, and SiGe, that can be deposited by various well-known deposition processes. Deposition of the electrode layer can be followed by a thermal anneal to improve the electrical properties of the structure 10.

Figure 4:
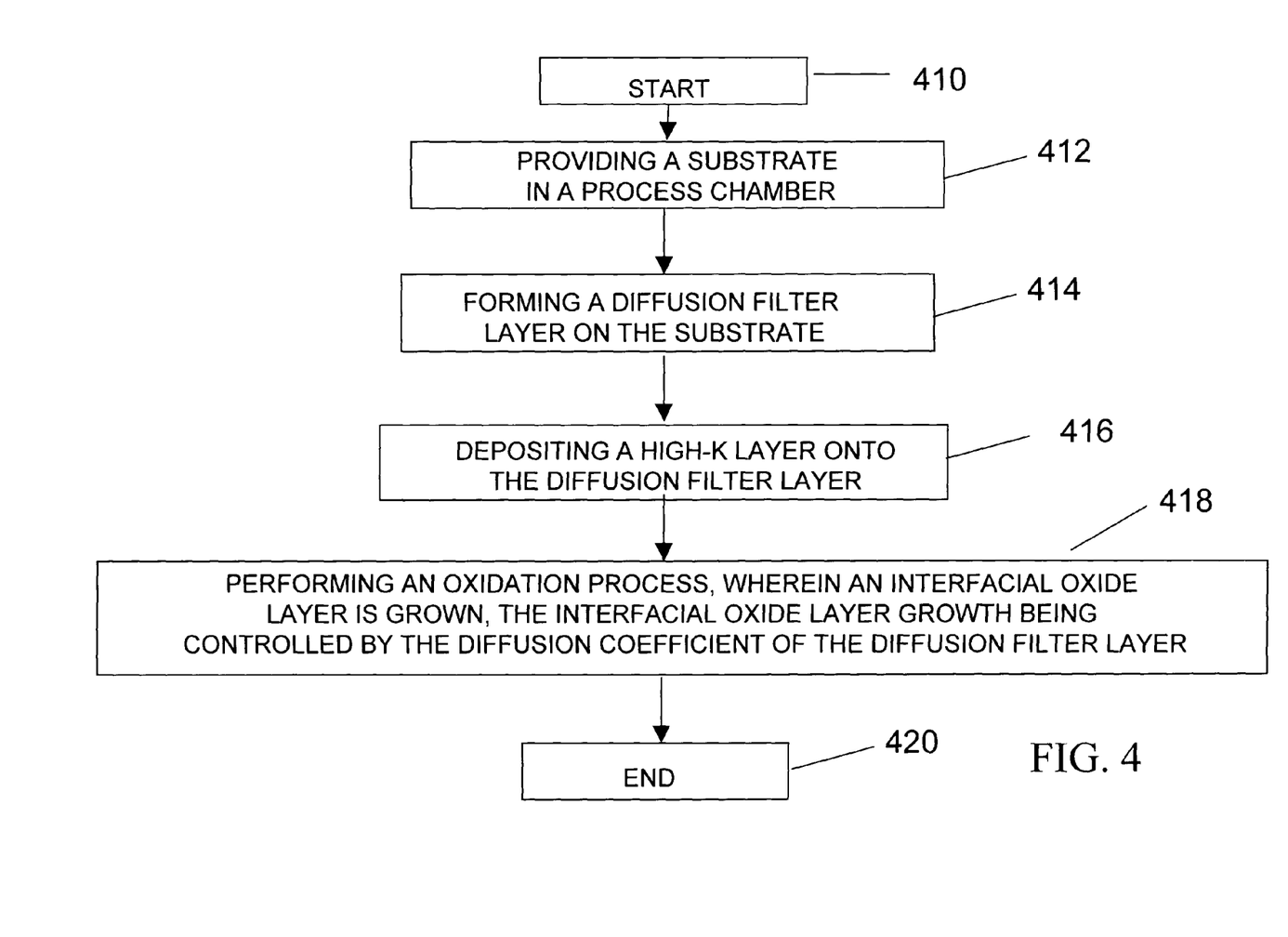
FIG. 4 shows a flowchart for forming a microstructure according to an embodiment of the invention.

FIG. 4 shows a flowchart for forming a microstructure according to an embodiment of the invention. In 410, the process is started. In 412, a substrate is provided in a process chamber. In 414, a diffusion filter layer is formed on the substrate, and in 416, a high-k layer is deposited onto the diffusion filter layer. In 418, an interfacial oxide layer is grown in an oxidation process, where the growth of the interfacial oxide layer is controlled by the diffusion coefficient of the diffusion filter layer. The oxidation process can, for example, be a self-limiting process. In an alternate embodiment, the oxidation process is not self-limiting. For example, oxidation time can be determined using the diffusion coefficient. The process ends in 420.

The diffusion coefficient of the diffusion filter layer and an oxidation process recipe for forming a desired interfacial oxide layer, can be determined by direct experimentation and/or design of experiments (DOE). The diffusion coefficient of the diffusion filter layer can, for example, be determined by measuring the thickness of the interfacial oxide layer as a function of the thickness of the diffusion filter layer and by controlling adjustable process parameters. Adjustable process parameters can, for example, comprise process time, temperature (e.g., substrate temperature), process pressure, and composition of the process gas. An oxidation process recipe that results in an interfacial oxide layer with a desired thickness, can be determined from the diffusion coefficient of the diffusion filter layer and the thickness of the high-k layer.

Figure 5:
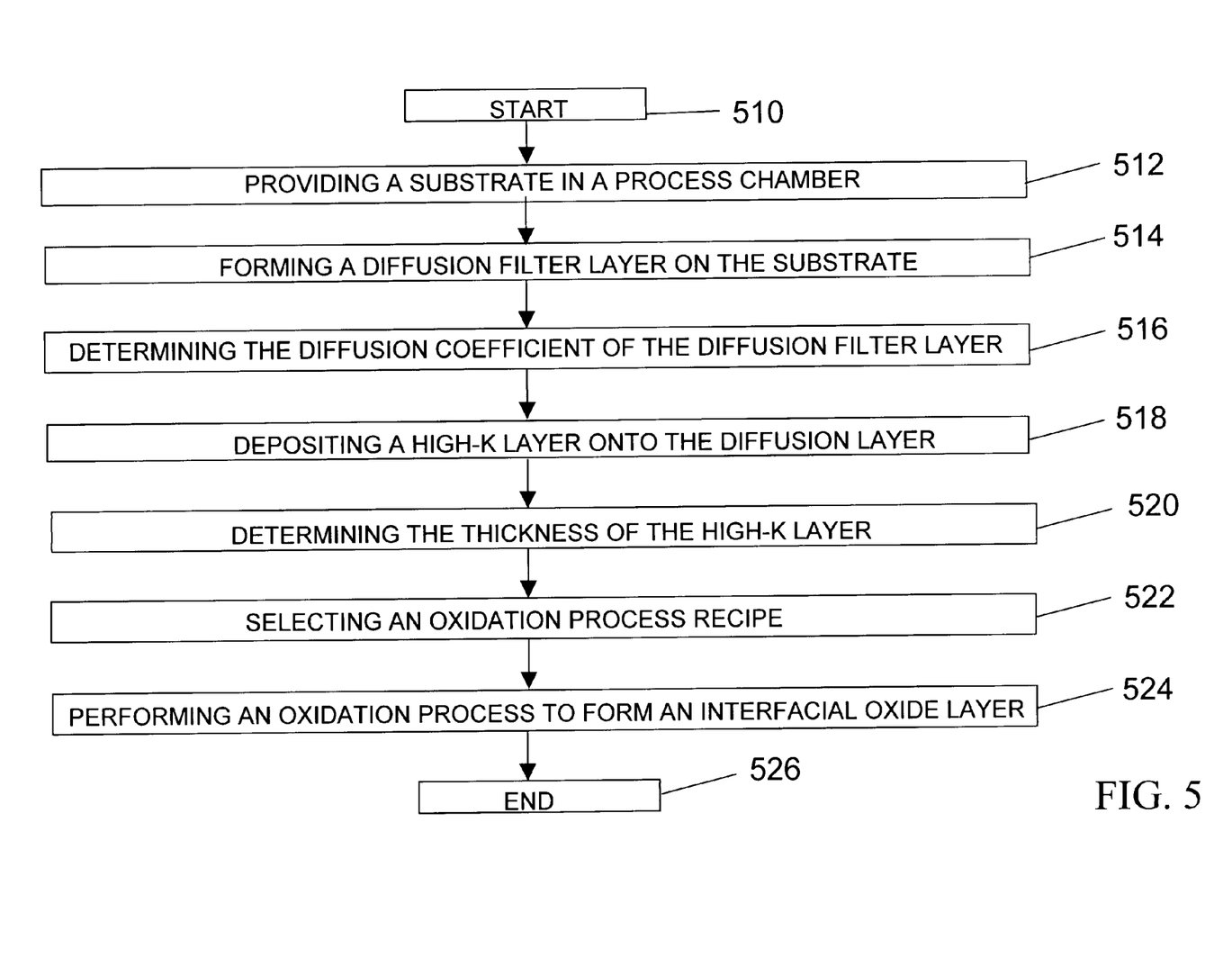
FIG. 5 shows a flowchart for forming a microstructure according to another embodiment of the invention.

FIG. 5 shows a flowchart for forming a microstructure according to another embodiment of the invention. In 510, the process is started. In 512, a substrate is provided in a process chamber. In 514, a diffusion filter layer is formed on the substrate, and in 516, the diffusion coefficient of the diffusion filter layer is determined. The diffusion coefficient can, for example, be determined from known or measured diffusion properties of the diffusion filter material and the thickness of the diffusion filter layer. The thickness of the diffusion filter layer can, for example, be measured using ellipsometry methods. In 518, a high-k layer is deposited onto the diffusion filter layer, and in 520, the thickness of the high-k layer is determined. The thickness of the high-k layer can, for example, be measured using ellipsometry methods. In 522, an oxidation process recipe is selected based on the diffusion coefficient of the diffusion filter layer and the thickness of the high-k layer. The oxidation process recipe can be selected from process conditions that are known to result in the formation of an interfacial oxide layer with a desired thickness, for a particular diffusion coefficient of the diffusion filter layer and thickness of the high-k layer., and in 524 an interfacial oxide layer with a desired thickness is grown in an oxidation process. The process ends in 526.

In an alternate embodiment, the diffusion coefficient can be recalculated during the oxidation process, for example by interrupting the oxidation process, measuring the thickness of the interfacial oxide layer, comparing the measured thickness to the expected thickness of the interfacial oxide layer, and recalculating the diffusion coefficient. If the measured thickness of the interfacial oxide layer varies from the expected thickness, the oxidation process can be changed based upon a recalculated diffusion coefficient. A change in the oxidation process can include a different process time and/or different process conditions, for example, substrate temperature, process gas flow, and composition of the process gas.

In an alternate embodiment of the invention, an interfacial oxide layer can be grown during the deposition of a high-k layer onto a diffusion filter layer. During the deposition of the high-k layer onto the diffusion filter layer, oxygen from the high-k layer and/or from an oxygen-containing gas can diffuse through the diffusion filter layer and form the interfacial oxide layer. Optionally, the deposition of the high-k layer can be followed by a thermal anneal to improve the electrical properties of the structure.

Figure 6:
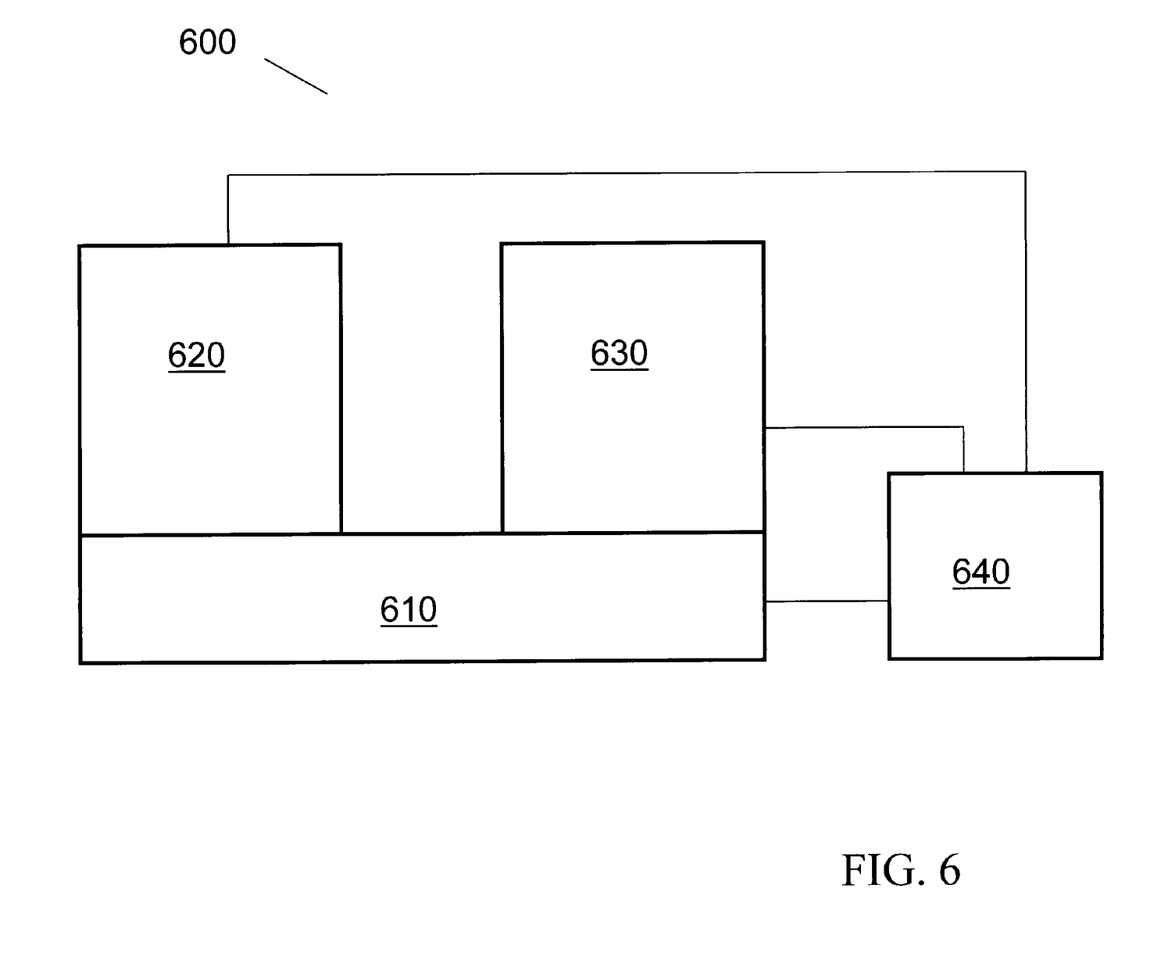
FIG. 6 shows a simplified block diagram of a processing tool for forming a microstructure according to an embodiment of the invention.

FIG. 6 shows a processing tool for forming a microstructure according to an embodiment of the invention. The processing tool 600 comprises processing systems 620 and 630, a (robotic) transfer system 610 configured for transferring substrates within the processing tool 600, and a controller 640 configured to control the processing tool 600. In another embodiment of the invention, the processing tool 600 can comprise a single processing system or, alternately, can comprise more than two processing systems. In FIG. 6, the processing systems 620 and 630, which are described in more detail below can, for example, perform at least one of the following processes: (a) perform a preclean process on a substrate, (b) form a diffusion filter layer on the substrate, (c) perform a surface preparation process on the diffusion filter layer, (d) deposit a high-k layer, (e) perform an oxidation process to form an interfacial oxide layer, and (f) determine the characteristics of at least one of the substrate, the diffusion filter layer, the high-k layer, and the interfacial layer. In one embodiment of the invention, each of the processes (a)–(f) can be performed in different processing systems. In another embodiment of the invention, at least two of the processes (a)–(f) are carried out in the same processing system.

Figure 7:
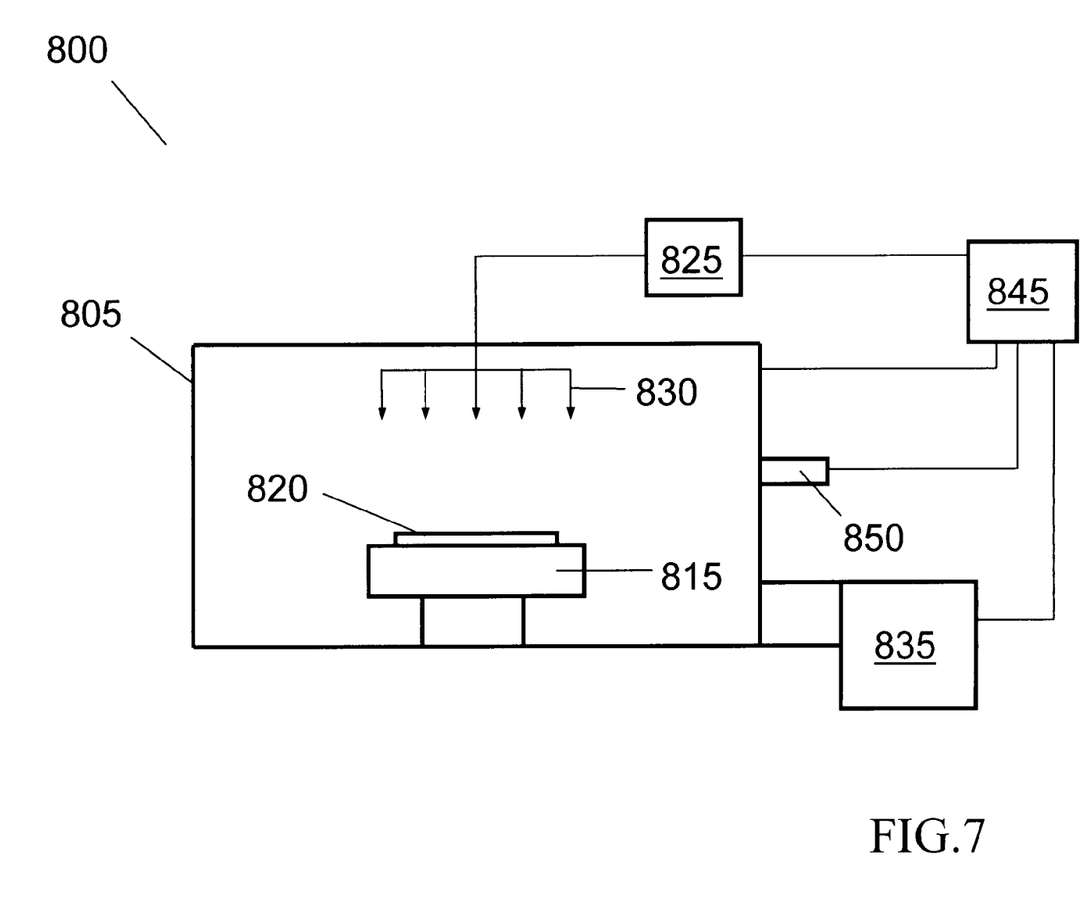
FIG. 7 shows a simplified block diagram of a processing system for forming a diffusion filter layer according to an embodiment of the invention.

FIG. 7 shows a processing system for forming a diffusion filter layer according to an embodiment of the invention. The processing system 800 in FIG. 7 is a single wafer processing system that comprises a process chamber 805. The process chamber 805 comprises a substrate holder 815, upon which a substrate 820 to be processed is affixed, a gas injection system 825 for introducing process gas 830 to the process chamber 805, and a vacuum pumping system 835. Controller 845 can be used to control the vacuum pumping system 835. Process gas 830 is introduced via the gas injection system 825, and the process pressure is adjusted. The gas injection system 825 allows independent control over the delivery of process gas 830 to the process chamber 805 from ex-situ gas sources. The gas injection system 825 can employ an effusive gas distribution source such as a showerhead, to expose the process gas 830 to the substrate 820.

The processing system 800 is capable of forming a diffusion filter layer on a substrate using a nitridation process that can be selected from thermal nitridation, direct plasma nitridation, remote plasma nitridation, UV-nitridation, and radical flow nitration. In another embodiment of the invention, the processing system 800 can be capable of depositing a diffusion filter layer using TCVD, PECVD, and/or ALD methods.

Substrate 820 is transferred into and out of process chamber 805 through a slot valve (not shown) and chamber feed-through (not shown) via robotic substrate transfer system where it is received by substrate lift pins (not shown) housed within substrate holder 815 and mechanically translated by devices housed therein. Once the substrate 820 is received from the substrate transfer system, it is lowered to an upper surface of the substrate holder 815.

The substrate 820 can be affixed to the substrate holder 815 via an electrostatic clamp (not shown). Furthermore, the substrate holder 815 further includes a temperature adjustment system including a re-circulating coolant flow that receives heat from the substrate holder 815 and transfers heat to a heat exchanger system (not shown), or when heating, transfers heat from the heat exchanger system. Moreover, gas may be delivered to the backside of the substrate to improve the gas-gap thermal conductance between the substrate 820 and the substrate holder 815. Such a system is utilized when temperature control of the substrate is required at elevated or reduced temperatures. Vacuum pump system 835 can include a turbo-molecular vacuum pump (TMP) capable of a pumping speed up to 5000 liters per second (and greater) and a gate valve for throttling the chamber pressure.

A controller 845 includes a microprocessor, a memory, and a digital I/O port capable of generating control voltages sufficient to communicate and activate inputs to the processing system 800 as well as monitor outputs from the processing system 800. Moreover, the controller 845 is coupled to and exchanges information with the process chamber 805, a process monitor system 850, the gas injection system 825 and the vacuum pump system 835. In addition, controller 845 is coupled to and interacts with controller 640 of the processing tool 600 (see FIG. 6). A program stored in the memory is utilized to control the aforementioned components of processing system 800 according to a stored process recipe. One example of controller 845 is a DELL PRECISION WORKSTATION 610™, available from Dell Corporation, Dallas, Tex.

Figure 8:
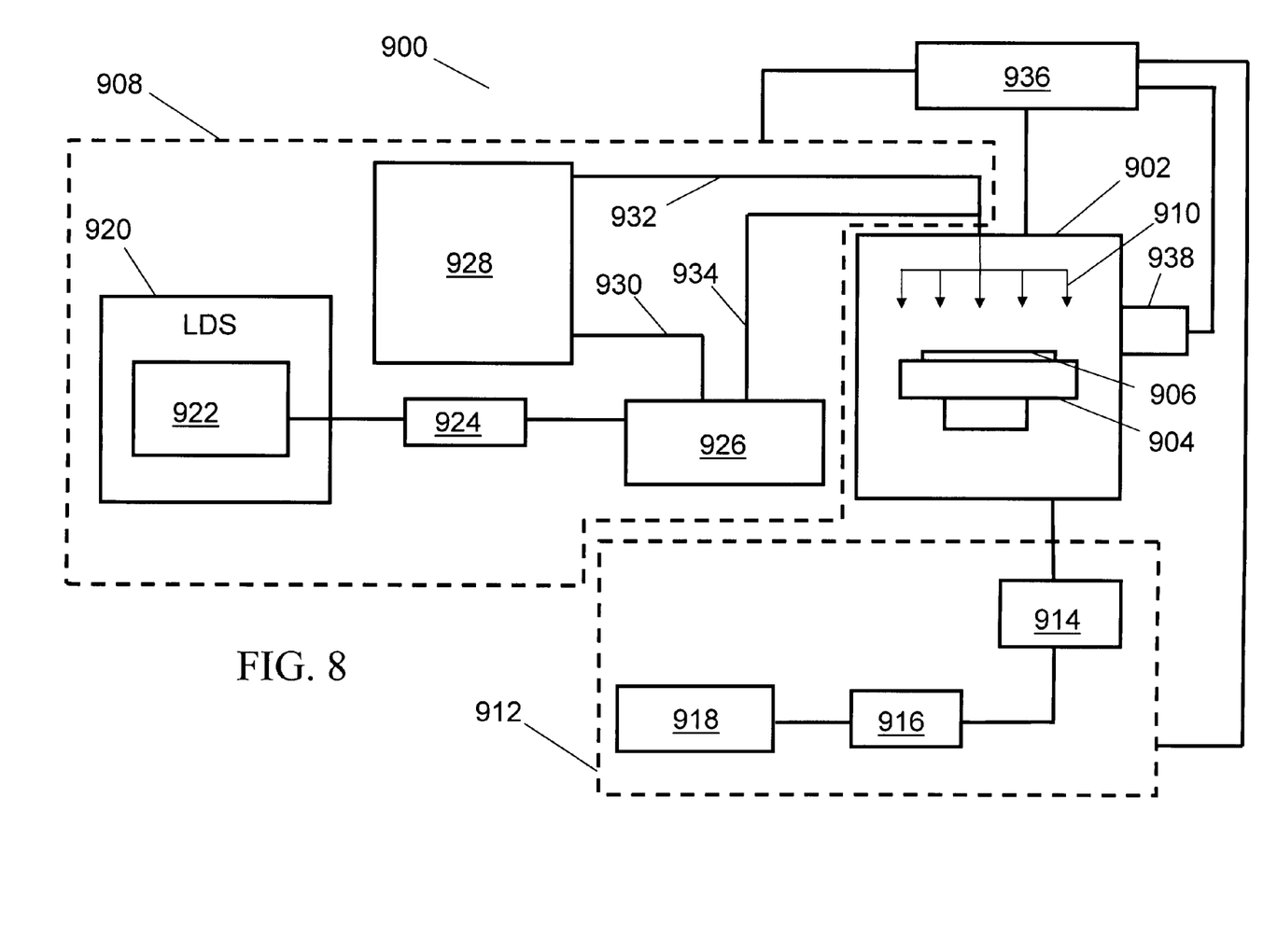
FIG. 8 shows a simplified block diagram of a processing system for depositing a high-k layer according to an embodiment of the invention.

The process monitor system 850 can, for example, comprise a mass spectrometer system to measure gaseous species in the process gas and other gases in the processing environment. In general, the process monitoring system 850 is a versatile diagnostic tool capable of performing multiple tasks such as process analysis and process compliance. The process monitor system 850 in FIG. 8 is attached to the processing chamber 805. In an alternate embodiment, some process monitor system components can be located downstream from the vacuum pump system 835. The process monitor system 850 can be used with controller 845 to determine the status of the process and provide feedback to ensure process compliance. In another embodiment, the process monitoring system can comprise a measurement chamber.

FIG. 8 shows a simplified block diagram of a processing system for depositing a high-k layer. The processing system 900 comprises a process chamber 902, a gas injection system 908, a pumping system 912, a process monitoring system 938, and a controller 936. The process chamber 902 comprises a substrate holder 904, upon which a substrate 906 to be processed is affixed. Substrate 906 can be transferred into and out of process chamber 902 through a slot valve (not shown) and chamber feed-through (not shown) via robotic substrate transfer system where it is received by substrate lift pins (not shown) housed within substrate holder 904 and mechanically translated by devices housed therein. Once the substrate 906 is received from the substrate transfer system, it is lowered to an upper surface of the substrate holder 904. The substrate 906 can, for example, be a Si substrate and, depending on the type of device being formed, can, for example, consist of a substrate of any diameter, for example, a 200 mm substrate, a 300 mm substrate, or an even larger substrate.

The substrate 906 can be affixed to the substrate holder 904 via an electrostatic clamp (not shown). Furthermore, the substrate holder 904 further includes a cooling system including a re-circulating coolant flow that receives heat from the substrate holder 904 and transfers heat to a heat exchanger system (not shown), or when heating, transfers heat from the heat exchanger system. Moreover, gas may be delivered to the backside of the substrate to improve the gas-gap thermal conductance between the substrate 906 and the substrate holder 904. Such a system is utilized when temperature control of the substrate is required at elevated or reduced temperatures.

A gas injection system 908 introduces process gas 910 to the process chamber 902. The gas injection system 908 comprises a liquid delivery system (LDS) 920 that includes at least one precursor source 922 containing a high-k precursor material. The flow of precursor material into vaporizer 926 can be controlled using a liquid mass flow controller (LMFC) 924. Vaporized precursor material 934 can be mixed with a carrier gas 930 from gas box 928 and delivered to the process chamber 902. Purge gases (e.g., Ar) and other gases (e.g., $O_2$, $N_2$, and $H_2O$) can be delivered directly from the gas box 928 to the process chamber 902 utilizing additional gas line 932. The gas injection system 908 allows independent control over the delivery of process gas 910 to the process chamber from ex-situ gas sources. The gas injection system 908 can employ an effusive gas distribution source such as a showerhead in the process chamber 902.

A vacuum pumping system 912 comprises a vacuum pump 918, a trap 916, and automatic pressure controller (APC) 914. The vacuum pump 918 can include a turbomolecular vacuum pump (TMP) capable of a pumping speed up to 5000 liters per second (and greater) and a gate valve for throttling the chamber pressure. Alternatively, the vacuum pump 918 can include a dry pump. During processing, process gas 910 can be introduced into the process chamber via the gas injection system 908 and the process pressure is adjusted by the APC 914. The trap 916 can collect unreacted precursor material and by-products from the process chamber.

A controller 936 includes a microprocessor, a memory, and a digital I/O port capable of generating control voltages sufficient to communicate and activate inputs of the processing system 900 as well as monitor outputs from the processing system 900. Moreover, the controller 936 is coupled to and exchanges information with the process chamber 902, the process monitoring system 938, the gas injection system 908, and the vacuum pumping system 912. In addition, controller 936 is coupled to and interacts with controller 640 of the processing tool 600 (see FIG. 6). A program stored in the memory is utilized to control the aforementioned components of a processing system 900 according to a stored process recipe. One example of controller 936 is a DELL PRECISION WORKSTATION 610™, available from Dell Corporation, Dallas, Tex.

The process monitoring system 938 can, for example, measure gaseous species, such as precursors, reaction by-products, and other gases in the processing environment. The process monitoring system 938 components in FIG. 9 are attached to the process chamber 902. In an alternate embodiment, some component of the process monitoring system 938 are located downstream from the process chamber 902. The process monitoring system 938 can be used with controller 936 to determine the status of the deposition process and provide feedback to ensure process compliance.

The substrate 906 is exposed to the process gas for a time period that results in the desired deposition of the high-k layer. Process conditions that enable the desired deposition of the high-k layer may be determined by direct experimentation and/or design of experiments (DOE). For example, adjustable process parameters can comprise time, temperature (e.g., substrate temperature), process pressure, process gases and relative gas flows of the process gases. The process parameter space for the deposition process can, for example, utilize a chamber pressure less than 10 Torr, a process gas flow rate less than 2000 sccm, a precursor gas flow rate less than 1000 sccm, and a substrate temperature greater than about 300° C.

When depositing a metal oxide high-k dielectric layer using CVD, a process gas comprising a metal-containing precursor is introduced into a processing chamber containing a heated substrate to be processed. The substrate is exposed to the process gas for a time period that results in the desired deposition of the metal oxide dielectric layer.

The process gas can further comprise a carrier gas (e.g., an inert gas) and an oxidizing gas. The inert gas can include at least one of Ar, He, Ne, Kr, Xe, and $N_2$. The addition of inert gas can, for example, dilute the process gas or adjust the process gas partial pressure(s). The oxidizing gas can, for example, contain an oxygen-containing gas comprising at least one of $O_2$, $O_3$, $H_2O$, $H_2O_2$, NO, $NO_2$, and $N_2O$. The role of the oxygen-containing gas in the deposition process can be to fill any oxygen vacancies in the metal oxide high-k layer, or to chemically modify the metal oxide precursor. The modification can involve interaction of the oxygen-containing gas with the metal oxide precursor in the gas phase or on the deposition surface.

Still referring to FIG. 8, real-time process monitoring can, for example, be carried out during the deposition process by the process monitoring system 938 using various spectroscopic methods. These methods include qualitative and quantitative analysis of the gaseous chemical species in the process environment using techniques such as mass spectroscopy (MS) and Fourier-Transform Infrared Spectroscopy (FTIR)). These techniques provide information on the identity and concentration of gaseous species during the deposition process, which in turn can be correlated to various physical properties of the deposited layer.

In another embodiment of the invention, a processing system for forming a diffusion filter layer on a substrate, depositing a high-k layer, and growing an interfacial oxide layer, can comprise batch type processing system capable of processing multiple substrates (wafers) simultaneously. The batch type processing systems can process substrates of any diameter, for example, 200 mm substrates, 300 mm substrates, or even larger substrates. A batch type process system can, for example, provide an advantage over single wafer process chambers by allowing long processing times for self-limiting processes.

It should be understood that various modifications and variations of the present invention may be employed in practicing the invention. It is therefore to be understood that, within the scope of the appended claims, the invention may be practiced otherwise than as specifically described herein.

What is claimed is:

1. A method of forming a microstructure, the method comprising:
   providing a substrate;
   forming a diffusion filter layer on the substrate;
   depositing a high-k layer onto the diffusion filter layer; and
   performing an oxidation process during and/or after said depositing wherein an interfacial oxide layer is grown between the diffusion filter layer and the substrate, the interfacial oxide layer growth being controlled by the diffusion coefficient of the diffusion filter layer.

2. The method according to claim 1, wherein the diffusion filter layer comprises at least one of a nitride layer, an oxynitride layer, or combinations or mixtures thereof.

3. The method according to claim 2, wherein the diffusion filter layer is formed in a nitridation process comprising at least one of thermal nitridation, direct plasma nitridation, remote plasma nitridation, plasma enhanced nitridarion, UV nitridation, and radical flow nitradation.

4. The method according to claim 3, wherein the nitradation process is carried out on a $SiO_2$ layer.

5. The method according to claim 3, wherein the nitridation process is carried out in a nitrogen-containing environment comprising at least one of NO, $N_2O$, $NO_2$, $N_2$, and $NH_3$.

6. The method according to claim 5, wherein the nitrogen-containing environment further comprises an inert gas.

7. The method according to claim 3, wherein the nitridation process is carried out of a substrate temperature below about 1000° C.

8. The method according to claim 2, wherein the diffusion filter layer is deposited onto the substrate in a deposition process.

9. The method according to claim 8, wherein the deposition process comprises at least one of TCVD, PECVD, and ALD.

10. The method according to claim 1, wherein the thickness of the diffusion filter layer is less than about 10 A.

11. The method according to claim 1, wherein a combined thickness of the diffusion filter layer and the interfacial oxide layer is less than about 20 A.

12. The method according to claim 1, wherein the oxidation process utilizes an oxygen-containing gas comprising at least one of $O_2$, $O_3$, $H_2O$, $H_2O_2$, NO, $NO_2$, and $N_2O$.

13. The method according to claim 12, wherein the oxidation process further comprises an inert gas.

14. The method according to claim 1, wherein the oxidation process is carried out at a substrate temperature between about 300° C. and about 1000° C.

15. The method according to claim 1, wherein the oxidation process is performed in the absence of an oxygen-containing gas.

16. The method according to claim 1, wherein the high-k layer comprises a metal oxide.

17. The method according to claim 16, wherein the metal oxide comprises at least one of $Ta_2O_5$, $TiO_2$, $ZrO_2$, $Al_2O_3$, $Y_2O_3$, $HfSiO_x$, $HfO_2$, $ZrSiO_x$, $TaSiO_x$, $SrSiO_x$, and $LaO_x$.

18. The method according to claim 16, wherein the high-k layer is deposited in the presence of an oxygen-containing gas.

19. The method according to claim 1, wherein the high-k layer is deposited in a deposition process comprising at least one of TCVD, PECVD, ALD, and PVD.

20. The method according to claim 1, wherein the thickness of the high-k layer is less than about 30 A.

21. The method according to claim 1, further comprising forming an electrode layer on the high-k layer.

22. The method according to claim 21, wherein the electrode layer comprises at least one of poly-Si, W, Al, TaN, TaSiN, HfN, HfSiN, TiN, TiSiN, Re, Ru, and SiGe.

23. The method according to claim 22, further comprising thermally annealing the electrode layer.

24. The method according to claim 1, wherein at least one of the diffusion filter layer and the interfacial oxide layer is formed by a self-limiting process.

25. The method according to claim 1, wherein the substrate comprises at least one of a semiconductor substrate, a LCD substrate, and a glass substrate.

26. The method according to claim 25, wherein the semiconductor substrate comprises at least one of a Si substrate and a compound semiconductor.

27. The method according to claim 1, further comprising:
    determining a diffusion coefficient of the diffusion filter layer;
    determining the thickness of the high-k layer; and
    selecting an oxidation process recipe.

28. The method according to claim 1, further comprising at least one of performing a preclean process on the substrate and performing a surface preparation process on the diffusion filter layer.

29. The method according to claim 1, further comprising determining the characteristics of at least one of the substrate, the diffusion filter layer, the high-k layer, and the interfacial layer.

30. The method according to claim 1, wherein the oxidation process is performed during the deposition of the high-k layer.

31. The method according to claim 30, wherein the oxidation process occurs in the presence of an oxygen-containing gas.

32. The method according to claim 30, wherein the oxidation process occurs in the absence of an oxygen-containing gas.

33. The method according to claim 1, wherein the diffusion filter layer further controls dopant and interlayer diffusion across the diffusion filter layer.

* * * * *